(12) United States Patent
Pitney

(10) Patent No.: US 10,184,193 B2
(45) Date of Patent: Jan. 22, 2019

(54) EPITAXY REACTOR AND SUSCEPTOR SYSTEM FOR IMPROVED EPITAXIAL WAFER FLATNESS

(71) Applicant: SunEdison Semiconductor Limited (UEN201334164H), Singapore (SG)

(72) Inventor: John Allen Pitney, St. Peters, MO (US)

(73) Assignee: GlobalWafers Co., Ltd. (TW)

( * ) Notice: Subject to any disclaimer, the term of this patent is extended or adjusted under 35 U.S.C. 154(b) by 253 days.

(21) Appl. No.: 15/157,745

(22) Filed: May 18, 2016

(65) Prior Publication Data

US 2016/0340799 A1    Nov. 24, 2016

Related U.S. Application Data

(60) Provisional application No. 62/162,969, filed on May 18, 2015.

(51) Int. Cl.
*C30B 25/12* (2006.01)
*C23C 16/458* (2006.01)
*C30B 29/06* (2006.01)

(52) U.S. Cl.
CPC .......... *C30B 25/12* (2013.01); *C23C 16/4584* (2013.01); *C30B 29/06* (2013.01)

(58) Field of Classification Search
CPC ..................................................... C30B 29/06
See application file for complete search history.

(56) References Cited

U.S. PATENT DOCUMENTS

| 5,260,538 | A | 11/1993 | Clary et al. |
| 5,405,658 | A | 4/1995 | Ibrahim et al. |
| 5,518,549 | A | 5/1996 | Hellwig |
| 5,765,890 | A | 6/1998 | Gaylord et al. |
| 5,792,273 | A | 8/1998 | Ries et al. |
| 5,891,250 | A | 4/1999 | Lottes et al. |
| 6,129,048 | A | 10/2000 | Sullivan |
| 6,315,828 | B1 | 11/2001 | Holder et al. |
| 6,458,202 | B1 | 10/2002 | Kojima et al. |
| 6,652,650 | B2 | 11/2003 | Yang et al. |
| 6,666,915 | B2 | 12/2003 | Yang et al. |

(Continued)

FOREIGN PATENT DOCUMENTS

| EP | 892091 A1 | 1/1999 |
| KR | 717237 B1 | 5/2007 |

(Continued)

*Primary Examiner* — Joseph A Miller, Jr.
(74) *Attorney, Agent, or Firm* — Armstrong Teasdale LLP

(57) ABSTRACT

A susceptor supports a semiconductor wafer and includes a substantially cylindrical body comprising an outer rim having an upper surface. The body also includes a recess extending into the body from the upper surface to a recess floor such that the recess is sized and shaped for receiving the wafer therein. The body further includes a ledge extending between the rim and the recess floor. The ledge includes a ramp comprising a first surface, a second surface, and a third surface. The first surface is oriented at a first angle with respect to the upper surface; the second surface is oriented at a second angle oriented with respect to the upper surface; and the third surface is oriented at a third angle with respect to the upper surface. Further, the second angle is greater than the first angle.

20 Claims, 9 Drawing Sheets

(56) References Cited

U.S. PATENT DOCUMENTS

| | | |
|---|---|---|
| 6,958,092 B2 | 10/2005 | Wilson et al. |
| 7,462,246 B2 | 12/2008 | Hellwig |
| 7,497,907 B2 | 3/2009 | Holder et al. |
| 8,404,049 B2 | 3/2013 | Hellwig et al. |
| 8,940,094 B2 | 1/2015 | Pitney et al. |
| 9,117,670 B2 | 8/2015 | Abedijaberi et al. |
| 9,401,271 B2 | 7/2016 | Pitney et al. |
| 2002/0078882 A1 | 6/2002 | Torack et al. |
| 2002/0124792 A1 | 9/2002 | Sreedharamurthy et al. |
| 2002/0185053 A1 | 12/2002 | Fei et al. |
| 2003/0037723 A9 | 2/2003 | Kommu et al. |
| 2005/0032337 A1 | 2/2005 | Wilson et al. |
| 2006/0180086 A1* | 8/2006 | Kanaya ............... C23C 16/4584 118/728 |
| 2006/0291835 A1* | 12/2006 | Nozaki ............ H01L 21/67115 392/416 |
| 2007/0074653 A1 | 4/2007 | Sreedharamurthy et al. |
| 2008/0314319 A1* | 12/2008 | Hamano ............. C23C 16/4583 118/728 |
| 2009/0165721 A1 | 7/2009 | Pitney et al. |
| 2010/0029066 A1 | 2/2010 | Miyashita |
| 2012/0309175 A1 | 12/2012 | Masumura |
| 2013/0295513 A1 | 11/2013 | Ferry |
| 2014/0033968 A1 | 2/2014 | Giannattasio et al. |
| 2014/0182511 A1 | 7/2014 | Rathod et al. |
| 2015/0360141 A1 | 12/2015 | Tomar et al. |
| 2016/0071760 A1 | 3/2016 | Liu |
| 2016/0215413 A1 | 7/2016 | Scala et al. |
| 2016/0340799 A1 | 11/2016 | Pitney |
| 2017/0022631 A1 | 1/2017 | Phillips et al. |

FOREIGN PATENT DOCUMENTS

| | | |
|---|---|---|
| TW | 438912 B | 6/2001 |
| WO | 2004044275 A2 | 5/2004 |
| WO | 2014062002 A1 | 4/2014 |
| WO | 2017019453 A1 | 2/2017 |

\* cited by examiner

EPITAXY REACTOR AND SUSCEPTOR SYSTEM FOR IMPROVED EPITAXIAL WAFER FLATNESS

CROSS REFERENCE TO RELATED APPLICATIONS

This application is a non-provisional and claims priority to U.S. Provisional Patent Application 62/162,969 filed May 18, 2015, which is hereby incorporated by reference in its entirety.

FIELD

The field of the disclosure generally relates to semiconductor wafer processing, and more particularly to susceptors for epitaxial processing.

BACKGROUND

Epitaxial chemical vapor deposition is a process for growing a thin layer of material on a semiconductor wafer so that the lattice structure is identical to that of the wafer. Using this process, a layer having different conductivity type, dopant species, or dopant concentration may be applied to the semiconductor wafer to achieve the necessary electrical properties.

Prior to epitaxial deposition, the semiconductor wafer is typically mounted on a susceptor in a deposition chamber of a reactor. The epitaxial deposition process begins by introducing a cleaning gas, to a front surface of the wafer to pre-heat and clean the front surface of the wafer. The cleaning gas removes native oxide from the front surface, permitting the epitaxial silicon layer to grow continuously and evenly on the surface during a subsequent step of the deposition process. The epitaxial deposition process continues by introducing a vaporous silicon source gas to the front surface of the wafer to deposit and grow an epitaxial layer of silicon on the front surface. A back surface opposite the front surface of the susceptor may be simultaneously subjected to hydrogen gas. The susceptor, which supports the semiconductor wafer in the deposition chamber during the epitaxial deposition, is rotated during the process to ensure the epitaxial layer grows evenly.

A common susceptor design includes a disk having a recess with a concave or sloped ledge. Such a shape provides a benefit in that the wafer only contacts the susceptor very near the edge of the back surface, so damage to the polished back surface is reduced. With increasing angle of slope of the ledge, the damage to the polished back surface may be further reduced. However, wafers typically have an orientation feature, generally a notch, which may allow the silicon source gas flowing across the front surface of the wafer to leak between the wafer and the susceptor at the notch. The leaking source gas leads to excessive growth on the back surface of the wafer near the notch, which in turn degrades the flatness of the wafer.

Accordingly, a need exists for a susceptor that reduces or eliminates wafer back surface defects caused by leaking source gas and also for a susceptor that corrects deviations in the deposition rate of silicon source gas near the edge of the silicon wafer.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a susceptor for supporting a semiconductor wafer in a heated chamber is provided. The wafer includes a front surface and a back surface opposite the front surface. The susceptor includes a substantially cylindrical body comprising an outer rim having an upper surface. The body also includes a recess extending into the body from the upper surface to a recess floor such that the recess is sized and shaped for receiving the wafer therein. The body further includes a ledge extending between the rim and the recess floor. The ledge includes a ramp comprising a first surface, a second surface, and a third surface. The first surface is oriented at a first angle with respect to the upper surface; the second surface is oriented at a second angle oriented with respect to the upper surface; and the third surface is oriented at a third angle with respect to the upper surface. Further, the second angle is greater than the first angle.

In another aspect, an epitaxial deposition reactor for growing a thin layer of material on a semiconductor wafer is provided. The reactor includes a reaction chamber defining an interior space and at least one rotatable support positioned within the reaction chamber. The reactor also includes a susceptor attached to the at least one support for supporting the semiconductor wafer. The susceptor includes a substantially cylindrical body comprising an outer rim having an upper surface. The body also includes a recess extending into the body from the upper surface to a recess floor such that the recess is sized and shaped for receiving the wafer therein. The body further includes a ledge extending between the rim and the recess floor. The ledge includes a ramp comprising a first surface, a second surface, and a third surface. The first surface is oriented at a first angle with respect to the upper surface; the second surface is oriented at a second angle oriented with respect to the upper surface; and the third surface is oriented at a third angle with respect to the upper surface. Further, the second angle is greater than the first angle.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
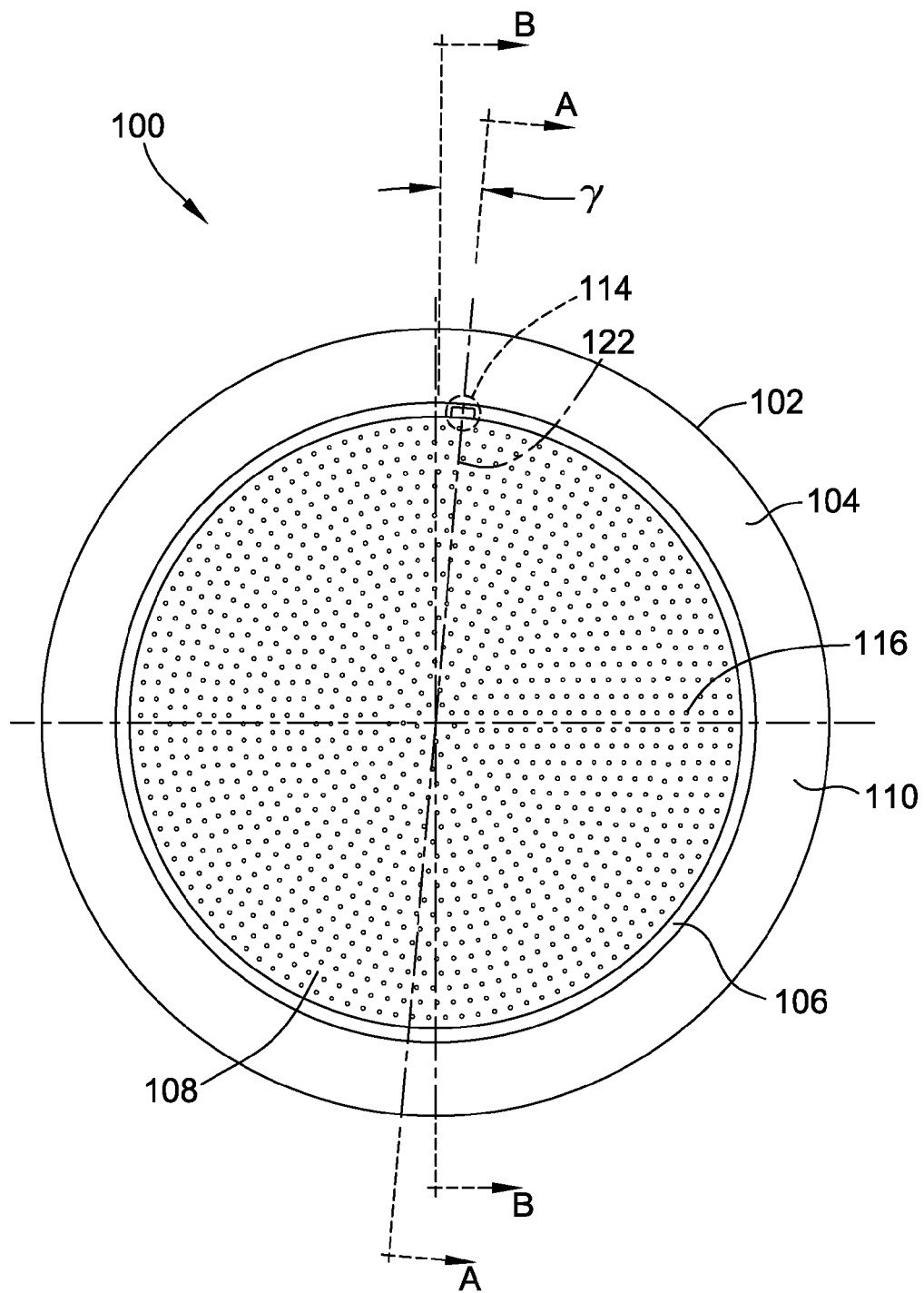
FIG. 1 is a top view of a susceptor according to an embodiment of the present disclosure.
Figure 2:
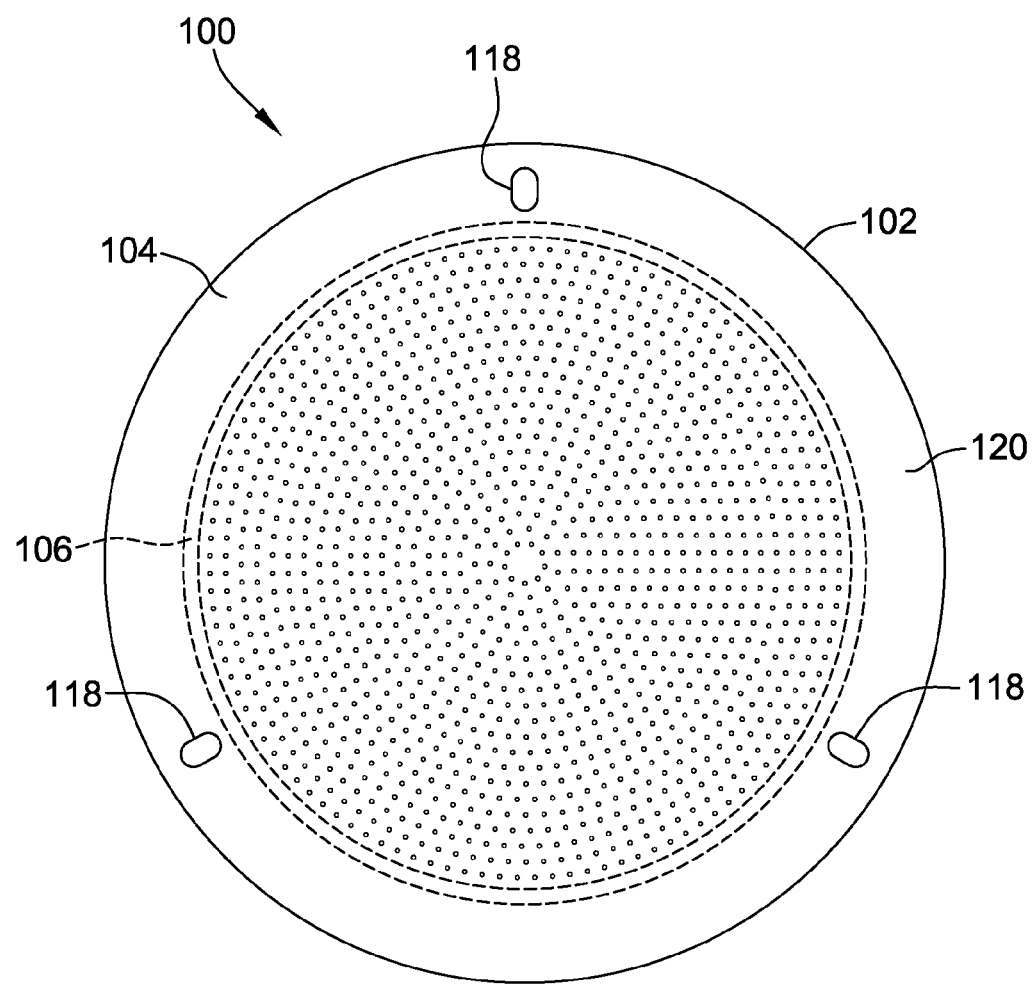
FIG. 2 is a bottom view of the susceptor of FIG. 1.

Referring now to the drawings, a susceptor is generally indicated in its entirety by the reference number 100. FIG. 1 is a top view of the susceptor 100 and FIG. 2 is a rear view of the susceptor 100. In the exemplary implementation, the susceptor 100 supports a semiconductor wafer (not shown in FIG. 1).

The susceptor 100 includes a body, generally designated by 102, having a substantially circular shape. The body 102 includes an outer rim 104, a ledge 106, and a recess 108 formed in a front surface 110 of the body 102. The ledge 106 is configured to support the wafer during processing. More specifically, although the susceptor 100 may have other overall dimensions without departing from the scope of the present disclosure, in one embodiment the susceptor 100 can be sized and configured such that the ledge 106 of the susceptor 100 can accommodate any diameter semiconductor wafer including, for example, 150 millimeter, 200 millimeter and 300 millimeter wafers.

Further, although the susceptor 100 may be made of other materials, in the embodiment illustrated in FIGS. 1 and 2, the susceptor 100 is constructed of conventional materials such as high purity graphite and has a silicon carbide layer covering the graphite to reduce the amount of contaminants released into the surrounding ambient from the graphite during the high temperature epitaxial deposition process.

The susceptor 100 also includes a plurality of holes 116 extending through the recess 108 of the body 102. It will be recognized by one skilled in the art that the holes 116 could be squares, slots, or any other shapes allowing fluid flow therethrough. The holes 116 are spaced on the susceptor 100 to allow a cleaning gas utilized during the pre-bake step of the epitaxial deposition process to contact and etch substantially the entire back surface of the semiconductor wafer. Holes 116 are spaced sufficiently apart to allow the cleaning gas to contact substantially the entire back surface of the semiconductor wafer such that it may etch substantially all of the native oxide from the back surface. Additionally, in the embodiment illustrated in FIGS. 1 and 2, the holes 116 generally form a plurality of concentric rings, for example, the holes 116 form approximately between 10 and 30 rings.

As shown in FIG. 2, susceptor 100 also includes three equally spaced, race-track-shaped holes 118 that extend into the susceptor 100 from a rear surface 120 for receiving the upper ends of conventional rotatable supports 206. These holes 118 engage the supports to prevent the susceptor 100 from slipping on the supports as they turn during processing.

Figure 3:
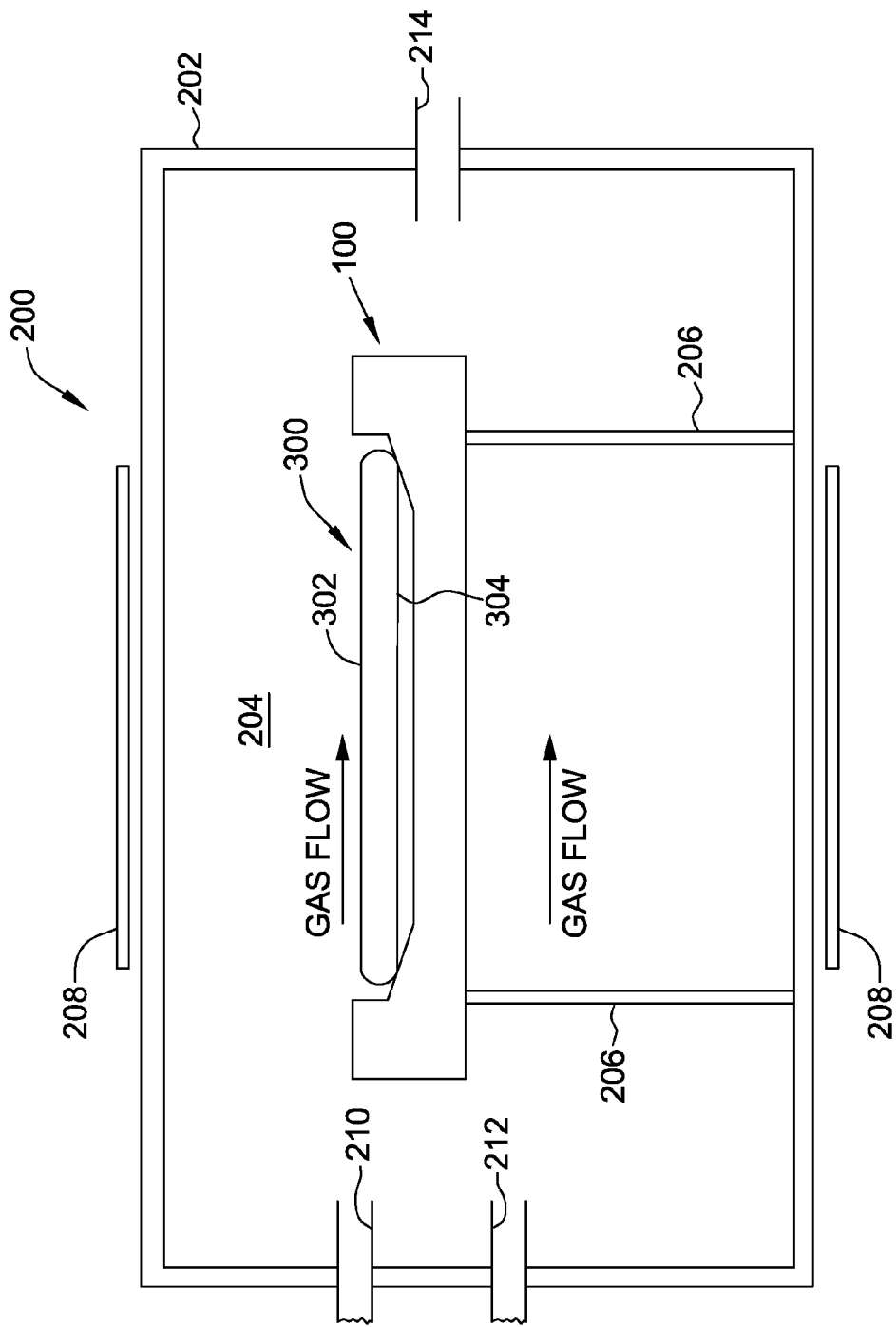
FIG. 3 is a schematic cross section of the susceptor of FIG. 1 supporting a semiconductor wafer in a chamber.

The susceptor 100 described above may be used as part of a reactor for chemical vapor deposition processes such as an epitaxial deposition process. Referring now to FIG. 3, a reactor for chemical vapor deposition processes is generally designated by 200. The reactor 200 includes an epitaxial reaction chamber 202 having an interior volume or space 204. The susceptor 100 described above is sized and shaped to be received within the interior space 204 of the chamber 202 and for supporting a semiconductor wafer 300. The susceptor 100 is attached to a pair of conventional rotatable supports 206 for rotating the susceptor 100 during the epitaxial process. The reaction chamber 202 also contains a heat source, for example heating lamp arrays 208 located above and below the susceptor 100 for heating the wafer 300 during an epitaxial deposition process. An upper gas inlet 210 and lower gas inlet 212 allow gas to be introduced into the interior space 204 of the chamber 202.

The epitaxial reaction chamber 202 containing the susceptor 100 described above may be used for both the cleaning and the growth steps of an epitaxial deposition process. In an example epitaxial deposition process, an epitaxial silicon layer is grown on a front surface 302 of the semiconductor wafer 300. In this embodiment, the silicon wafer 300 is introduced into the epitaxial deposition chamber 202 at atmospheric pressure and centered on the susceptor 100. A cleaning gas, such as hydrogen or a mixture of hydrogen and hydrogen chloride, is introduced into the chamber 202 through inlet 210 to remove the native oxide layers on the front 302 and back surfaces 304 of the semiconductor wafer 300.

Once the native oxide layers have been removed from both the front and back surfaces 302 and 304 of the semiconductor wafer 300, the cleaning gas is discontinued and the temperature in the reaction chamber 202 is adjusted to between about 600° C. and about 1200° C. A silicon containing source gas such as silane, dichlorosilane, or trichlorosilane, for example, is introduced through inlet 210 above the front surface 302 of the semiconductor wafer 300 at a flow rate of between about 1 liter/minute and about 50 liters/minute for a period of time sufficient to grow an epitaxial silicon material layer on the front surface 302 of the semiconductor wafer 300 having a thickness of between about 0.1 and about 200 micrometers. At the same time the silicon containing source gas is introduced into the deposition chamber 202 through inlet 210 above the front surface 302 of the semiconductor wafer 300, a gas such as nitrogen, argon, hydrogen, a mixture thereof or the source gas is introduced through inlet 212 below the back surface 304 of the semiconductor wafer 300 at a flow rate of between about 1 liter/minute and about 80 liters/minute such that the purge gas can contact the back surface 304 of the semiconductor wafer 300 and carry out-diffused dopant atoms from the back surface 304 toward to an exhaust outlet 214.

In the embodiment illustrated in FIGS. 1 and 2, the ledge 106 of body 102 includes a ramp 114 that is configured to reduce or prevent the formation of a hump on a back surface of the wafer. More specifically, the ramp 114 is aligned with a notch formed in the wafer 300 such that the ramp 114 is configured to reduce a buildup of the epitaxial silicon layer proximate the notch, as described in further detail below.

Figure 4:
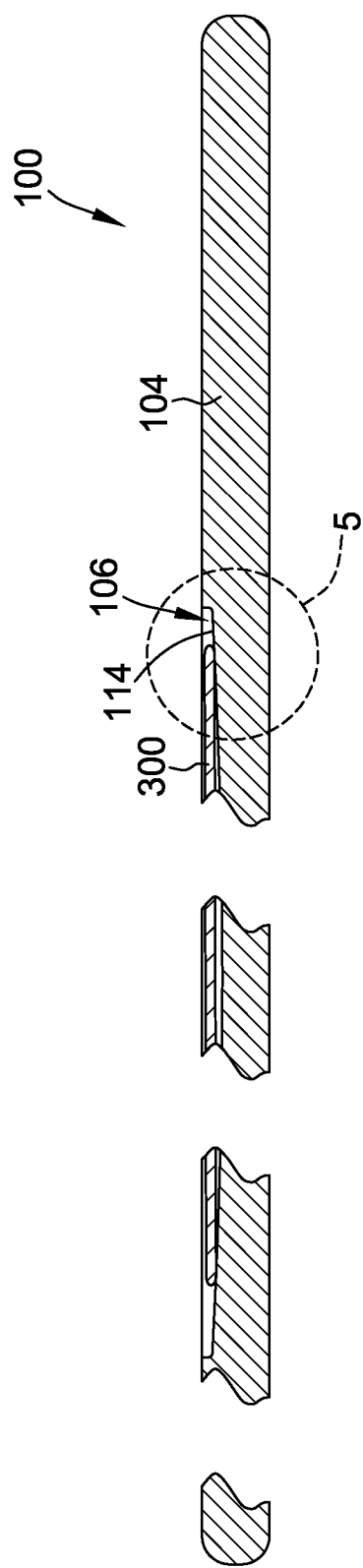
FIG. 4 is a cross section of the susceptor of FIG. 1 taken along line A-A of FIG. 1.
Figure 5:
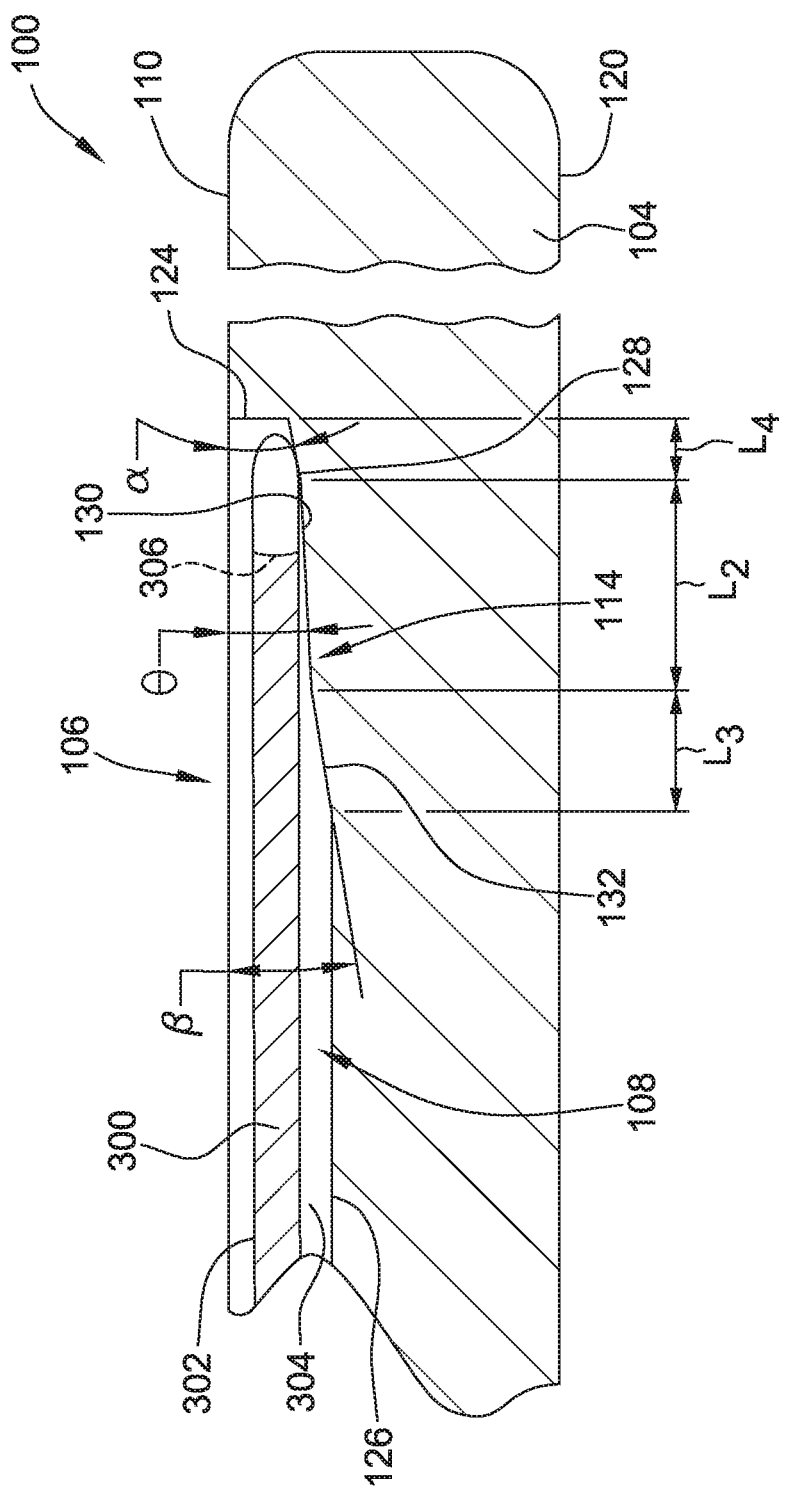
FIG. 5 is an enlarged view of a portion of the susceptor shown in FIG. 4.
Figure 6:
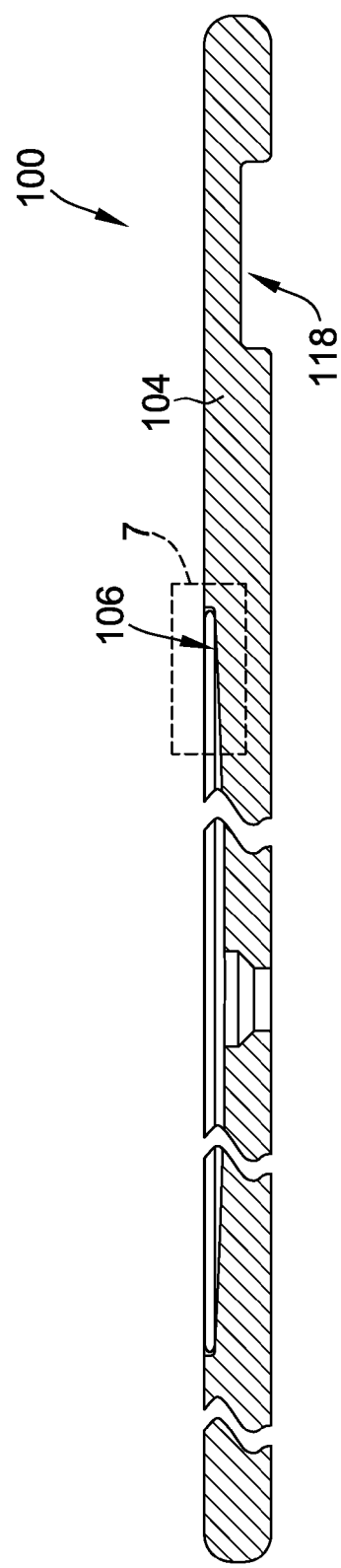
FIG. 6 is a cross section of the susceptor of FIG. 1 taken along line B-B of FIG. 1.

FIG. 4 is a cross section of the susceptor 100 taken along line A-A, as shown in FIG. 1. FIG. 5 is an enlarged view of a portion of the susceptor 100 shown in FIG. 4 highlighting the ramp 114 of the ledge 106. FIG. 6 is a cross section of the susceptor 100 of FIG. 1 taken along line B-B, as shown in FIG. 1. Additionally, FIG. 7 is an enlarged view of a portion of the susceptor 100 shown in FIG. 6 illustrating the ledge 106.

Figure 7:
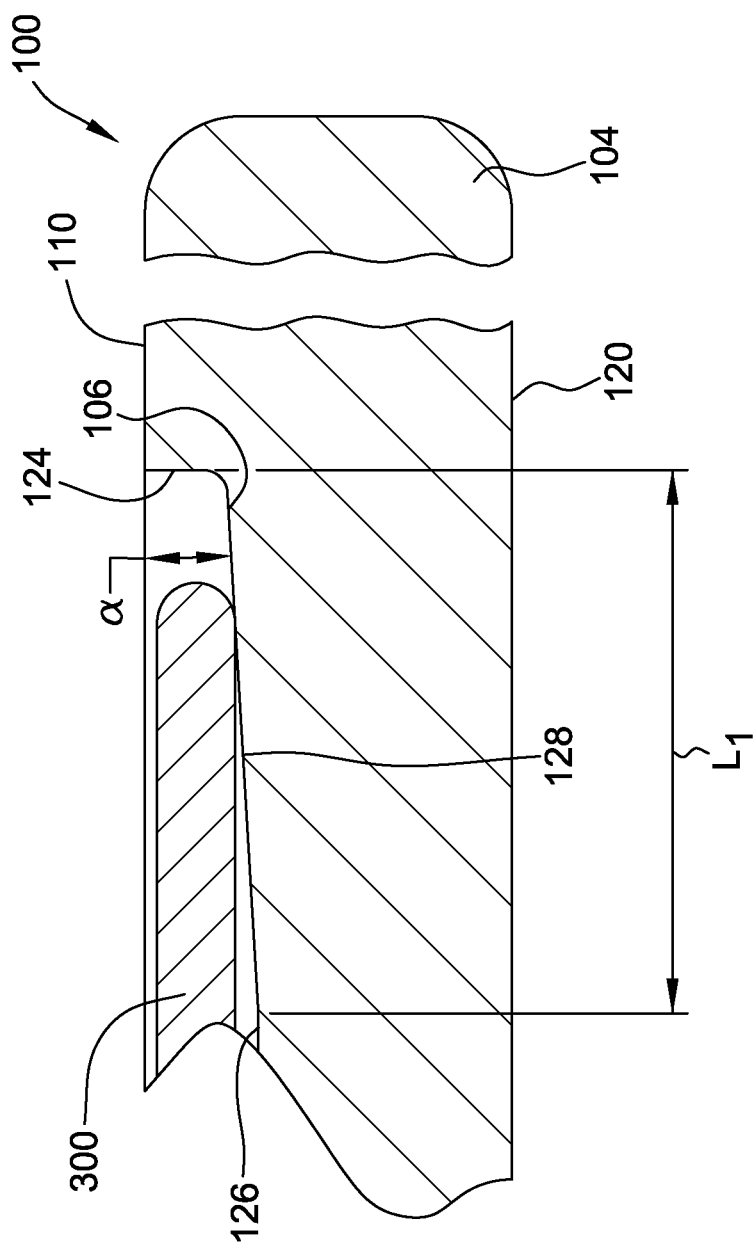
FIG. 7 is an enlarged view of a portion of the susceptor shown in FIG. 6.

FIG. 7 illustrates a cross-sectional view of the ledge 106 taken along line B-B. The ledge 106 extends between a substantially cylindrical recess wall 124 and a recess floor 126. In one embodiment, the recess floor 126 is curved to account for bowing of the wafer 300 during processing. The ledge 106 includes a ledge surface 128 that extends inward from a lower end of the wall 124 to the recess floor 126 for a length of L1. The surface 128 also slopes downward from the wall 124 toward the recess floor 126. The surface 128 supports the wafer 300. As shown in FIG. 7, the surface 128 is oriented at a downward angle α, which results in narrow line of contact between the wafer 300 and the surface 128.

In one embodiment, the angle is between approximately 2° to approximately 4°. In another suitable embodiment, the angle α is any angle that enables the susceptor 100 to operate as described herein.

Figure 8:
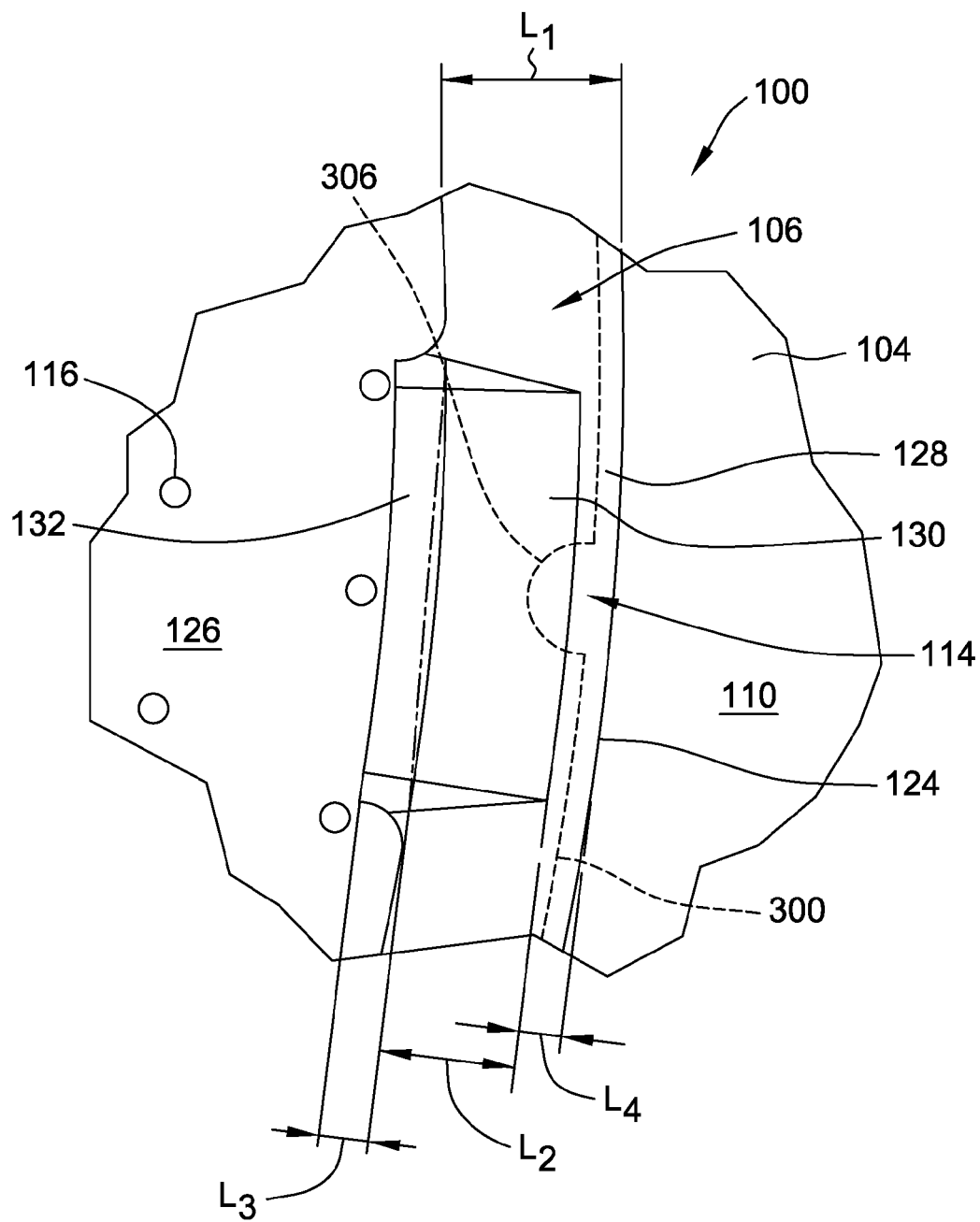
FIG. 8 is an enlarged view of a portion of the susceptor shown in FIG. 1 illustrating a ramp.
Figure 9:
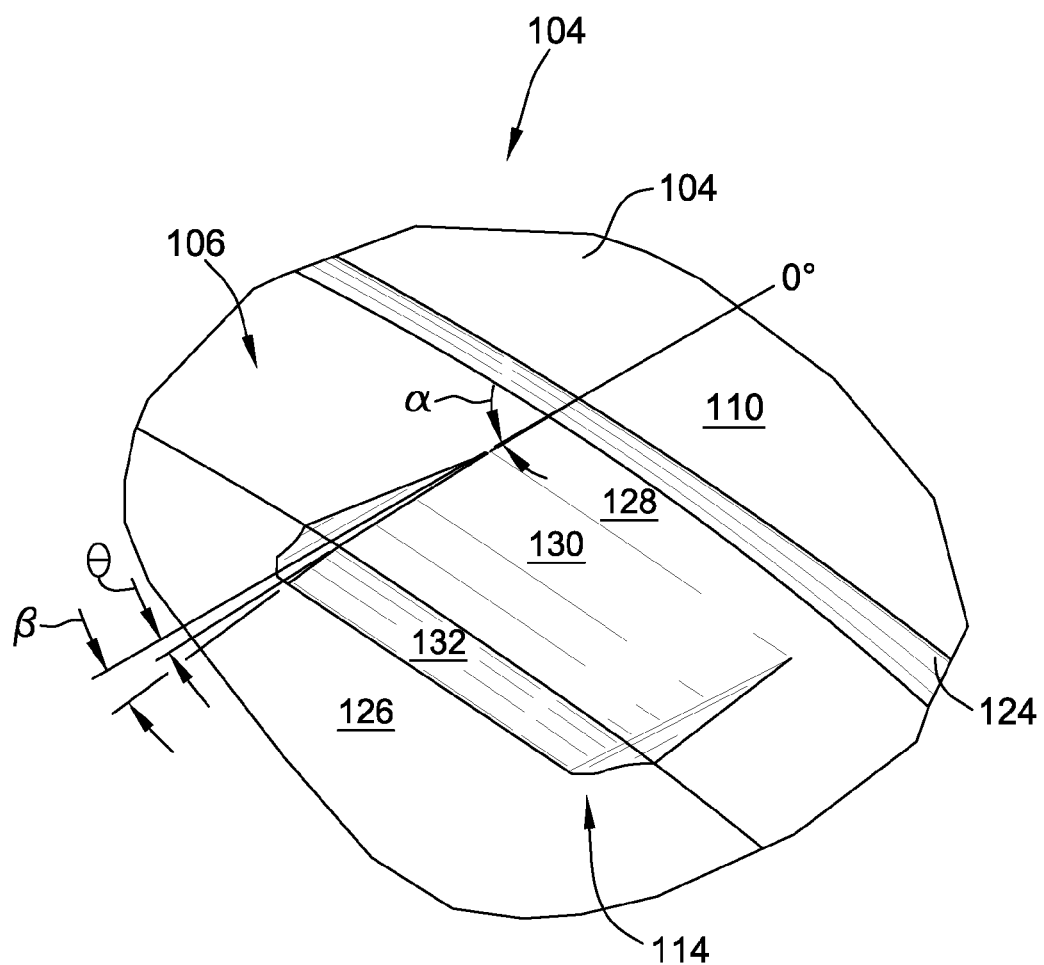
FIG. 9 is a perspective view of the ramp shown in FIG. 8.

Referring now to FIG. 5 and to FIG. 8, the ramp 114 of the ledge 106 is shown in cross section. More specifically, the ramp 114 is shown as aligned with a notch 306 formed in the wafer 300. With respect to FIG. 8, the wafer 300 and the notch 306 are shown in broken lines. As described herein, the ramp 114 facilitates reducing excessive epitaxial deposition proximate the notch 306. As the silicon containing source gas is distributed over the front surface 302 of the wafer 300 to form the epitaxial material layer, a portion of the source gas may leak between the wafer 300 and the susceptor 100 at the notch 306. To prevent a buildup of source gas, and therefore excess epitaxial layer thickness, on the back surface 304 proximate the notch 306, the ramp 114 directs the source gas away from the notch 306. More specifically, the ramp 114 prevents a buildup of epitaxial material from the notch 306 inward by about 2.5 mm, about 3.0, or even about 3.5 millimeters.

The ramp 114 includes a first surface 130 that extends from the ledge surface 128 toward the recess floor 126 and a second surface 132 that extends from the first surface 130 to the recess floor 126. As such, the first surface 130 is positioned radially outward from the second surface 132. In the illustrated embodiment, the ledge surface 128 extends from the recess wall 124 and is positioned radially outward from the first surface 130.

The first surface 130 is oriented at an angle θ with respect to the front surface 110 of the rim 104 and the second surface 132 oriented at a different angle β with respect to the front surface 110.

In the illustrated embodiment, the angle β is greater than the angle θ such that the first surface 130 facilitates blocking a flow of gas from reaching the wafer 300 proximate the notch 306. More specifically, the angle β is within a range of between approximately 3.0° to approximately 10.0°, suitably 5°, and the angle θ is within a range of between approximately 0.0° to approximately 3.0°, suitably 1.0°. In another suitable embodiment, the angles θ and β are any angles that facilitate operation of the susceptor 100 as described herein. Additionally, in the illustrated embodiment, the angle α of the ledge surface 128 is between the angles θ and β of the first and second surfaces 130 and 132, respectively.

The first surface 130 also includes a radial length L2 that is longer than a radial length L3 of the second surface 132. Alternatively, length L2 of first surface 130 may be shorter than length L3 of second surface 132. In the illustrated embodiment, the ledge surface 128 has a radial length of L4 at the ramp 114 such that lengths L2, L3, and L4, when combined, are greater than the length L1 of the ledge surface 128 not including the ramp 114. In another suitable embodiment, the lengths L2, L3, and L4, when combined, are equal to or less than the length L1 of the ledge surface 128 not including the ramp 114.

The example susceptor described herein includes a ramp formed in the ledge of a susceptor. The ramp is aligned with an orientation notch formed in the wafer and facilitates improving the flatness of the wafer by preventing the leakage of process gas between the wafer and the susceptor at the notch. More specifically, the ramp directs the process gas to prevent a buildup of excess film thickness, created by the process gas, proximate the notch. The ramp includes a first surface at a shallow ledge angle and a second surface at a steeper ledge angle. The varying slopes facilitate blocking process gas from reaching the rear surface of the wafer and forming a hump proximate the notch.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An epitaxial deposition reactor for growing a thin layer of material on a semiconductor wafer, the reactor comprising:
   a reaction chamber defining an interior space;
   at least one rotatable support positioned within the reaction chamber; and
   a susceptor attached to the at least one support, wherein the susceptor is configured to support the semiconductor wafer, the susceptor comprising:
      a substantially cylindrical body comprising an outer rim having an upper surface;
      a recess extending into the body from the upper surface to a recess floor, the recess being sized and shaped for receiving the semiconductor wafer therein; and
      a ledge extending between the rim and the recess floor, wherein the ledge includes a ramp including:
         a first surface oriented at a first acute angle with respect to the upper surface;
         a second surface obliquely oriented at a second acute angle with respect to the upper surface, wherein the second angle is greater than the first angle; and
         a third surface obliquely oriented at a third acute angle with respect to the upper surface, the third surface positioned radially outward from the first and second surfaces, wherein the first surface is positioned radially outward from the second surface, and
      wherein the ledge includes a plurality of ramps.

2. The reactor of claim 1, wherein the first angle is between approximately 0.0° and approximately 3.0°.

3. The reactor of claim 1, wherein the second angle is between approximately 3.0° and approximately 10.0°.

4. The reactor of claim 1, wherein the ramp is aligned with a notch formed in the wafer such that the ramp is configured to reduce a buildup of the material proximate the notch.

5. The reactor of claim 1, wherein the first surface comprises a first length and the second surface comprises a second length that is shorter than the first length.

6. The reactor of claim 5, wherein the third surface comprises a third length that is shorter than the first length and the second length.

7. The reactor of claim 1, wherein the second angle is greater than the first and third angles and the third angle is greater than the first angle.

8. The reactor of claim 1, wherein the third surface extends from a recess wall such that the third surface is positioned radially outward from the first surface and the second surface.

9. A susceptor for supporting a wafer in a heated chamber, the wafer having a front surface, a back surface opposite the front surface, the susceptor comprising:
   a substantially cylindrical body comprising an outer rim having an upper surface;

a recess extending into the body from the upper surface to a recess floor, the recess being sized and shaped for receiving the wafer therein; and a ledge extending between the rim and the recess floor, wherein the ledge includes a ramp comprising:

a first surface oriented at a first acute angle with respect to the upper surface;

a second surface obliquely oriented at a second acute angle with respect to the upper surface, wherein the second angle is greater than the first angle; and a third surface obliquely oriented at a third acute angle with respect to the upper surface, the third surface is positioned radially outward from the first and second surfaces, wherein the first surface is positioned radially outward from the second surface.

10. The susceptor of claim 9, wherein the ledge includes a plurality of ramps.

11. The susceptor of claim 9, wherein the first angle is between approximately 0.0° and approximately 3.0°.

12. The susceptor of claim 9, wherein the second angle is between approximately 3.0° and approximately 10.0°.

13. The susceptor of claim 9, wherein the ramp is aligned with a notch formed in the wafer such that the ramp is configured to reduce a buildup of a material proximate the notch.

14. The susceptor of claim 9, wherein the first surface comprises a first length and the second surface comprises a second length that is shorter than the first length.

15. The susceptor of claim 14, wherein the third surface comprises a third length that is shorter than the first length and the second length.

16. The susceptor of claim 9, wherein the second angle is greater than the first and third angles and the third angle is greater than the first angle.

17. The susceptor of claim 9, wherein the third surface extends from a recess wall such that the third surface is positioned radially outward from the first surface and the second surface.

18. An epitaxial deposition reactor in combination with a semiconductor wafer having a notch, the reactor comprising:

a reaction chamber defining an interior space;

a susceptor positioned within the reaction chamber, wherein the susceptor supports the semiconductor wafer, the susceptor comprising:

a substantially cylindrical body comprising an outer rim having an upper surface;

a recess extending into the body from the upper surface to a recess floor, the recess being sized and shaped to receive the semiconductor wafer therein; and a ledge extending between the rim and the recess floor, wherein the ledge includes a ramp including:

a first surface oriented at a first acute angle with respect to the upper surface;

a second surface obliquely oriented at a second acute angle with respect to the upper surface, wherein the second angle is greater than the first angle; and a third surface obliquely oriented at a third acute angle with respect to the upper surface, the third surface positioned radially outward from the first and second surfaces, wherein the first surface is positioned radially outward from the second surface.

19. The susceptor of claim 18, wherein the second angle is between approximately 3.0° and approximately 10.0°.

20. The susceptor of claim 18, wherein the ramp is aligned with the notch formed in the wafer such that the ramp is configured to reduce a buildup of a material proximate the notch.

* * * * *